US009454505B2

(12) United States Patent
Decesaris et al.

(10) Patent No.: US 9,454,505 B2
(45) Date of Patent: *Sep. 27, 2016

(54) CHIP SELECT ('CS') MULTIPLICATION IN A SERIAL PERIPHERAL INTERFACE ('SPI') SYSTEM

(71) Applicant: LENOVO ENTERPRISE SOLUTIONS (SINGAPORE) PTE. LTD., Singapore (SG)

(72) Inventors: Michael Decesaris, Carrboro, NC (US); Steven C. Jacobson, Mebane, NC (US); Luke D. Remis, Raleigh, NC (US); Gregory D. Sellman, Morrisville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/672,898

(22) Filed: Mar. 30, 2015

(65) Prior Publication Data
US 2015/0205754 A1 Jul. 23, 2015

Related U.S. Application Data

(63) Continuation of application No. 13/530,284, filed on Jun. 22, 2012, now Pat. No. 9,015,394.

(51) Int. Cl.
G06F 13/40 (2006.01)
G06F 13/00 (2006.01)
G06F 13/42 (2006.01)
G06F 1/32 (2006.01)
G06F 11/34 (2006.01)
H03M 1/34 (2006.01)

(52) U.S. Cl.
CPC ......... *G06F 13/4291* (2013.01); *G06F 1/3215* (2013.01); *G06F 11/349* (2013.01); *G06F 13/4282* (2013.01); *H03M 1/34* (2013.01)

(58) Field of Classification Search
CPC ......... G06F 13/40; G06F 13/00; H03M 1/34
See application file for complete search history.

(56) References Cited

U.S. PATENT DOCUMENTS

| 4,742,486 | A  | * | 5/1988  | Takemae | G01R 31/31701 365/189.07 |
|-----------|----|---|---------|---------|--------------------------|
| 5,272,725 | A  |   | 12/1993 | Jones et al. | |
| 6,321,366 | B1 |   | 11/2001 | Tseng et al. | |
| 7,174,406 | B1 |   | 2/2007  | Abdallah et al. | |
| 7,417,576 | B2 | * | 8/2008  | Prestros | H03M 1/48 341/155 |
| 7,694,053 | B2 |   | 4/2010  | Kippley et al. | |

(Continued)

*Primary Examiner* — Henry Tsai
*Assistant Examiner* — Christopher A Daley
(74) *Attorney, Agent, or Firm* — Brandon C. Kennedy; Katherine S. Brown; Kennedy Lenart Spraggins LLP

(57) ABSTRACT

Chip select ('CS') multiplication in an SPI system that includes an SPI master, a CS multiplier, a plurality of SPI slaves, and a fall time detection circuit, where the SPI master is coupled to the CS multiplier and the fall time detection circuit by a CS signal line, the CS multiplier includes a plurality of CS outputs with each CS output coupled to an SPI slave, and CS multiplication includes: receiving, from the SPI master, the CS signal on the CS signal line; detecting fall time of the CS signal; and, if the fall time of the CS signal is less than a predefined threshold, configuring, by the fall-time detection circuit, the CS multiplier to vary from providing a CS signal on a first CS output to providing a CS signal on a second CS output.

18 Claims, 4 Drawing Sheets

(56) References Cited

U.S. PATENT DOCUMENTS

| | | |
|---|---|---|
| 7,805,559 B1 | 9/2010 | Stumpf et al. |
| 8,453,006 B2 | 5/2013 | Lin |
| 8,892,799 B2 | 11/2014 | Frese |
| 8,954,634 B2 * | 2/2015 | DeCesaris ............ G06F 13/4291 710/15 |
| 9,015,394 B2 * | 4/2015 | DeCesaris ............ G06F 13/4282 341/164 |
| 2007/0143512 A1 | 6/2007 | Kuo |
| 2008/0122426 A1 | 5/2008 | Prestros |
| 2011/0060856 A1 | 3/2011 | Huang et al. |
| 2011/0078350 A1 * | 3/2011 | Carls ........................ G06F 1/04 710/110 |
| 2011/0194595 A1 * | 8/2011 | Shetty ................... H04W 52/52 375/224 |
| 2013/0343197 A1 | 12/2013 | DeCesaris et al. |
| 2013/0346658 A1 | 12/2013 | DeCesaris et al. |
| 2013/0346763 A1 * | 12/2013 | DeCesaris ............ G06F 13/4291 713/300 |
| 2013/0346835 A1 | 12/2013 | DeCesaris et al. |
| 2014/0019644 A1 | 1/2014 | Decesaris et al. |
| 2014/0207984 A1 | 7/2014 | Maung et al. |

* cited by examiner

CHIP SELECT ('CS') MULTIPLICATION IN A SERIAL PERIPHERAL INTERFACE ('SPI') SYSTEM

CROSS-REFERENCE TO RELATED APPLICATION

This application is a continuation application of and claims priority from U.S. patent application Ser. No. 13/530,284, filed on Jun. 22, 2012.

BACKGROUND OF THE INVENTION

1. Field of the Invention

The field of the invention is data processing, or, more specifically, methods, apparatus, and products for chip select ('CS') multiplication in a Serial Peripheral Interface ('SPI') system.

2. Description of Related Art

Many computing devices today utilize Serial Peripheral Interface ('SPI') Read Only Memory (ROM) for initial boot code. Over time, however, such ROMs may become corrupted. One common solution is to utilize two ROMs; one a primary and one as a backup. Utilizing two ROM devices instead of one, however, requires an additional chip select line, which is generally scarce in SPI systems.

SUMMARY OF THE INVENTION

Methods, apparatus, and products for CS multiplication in an SPI system are disclosed in this specification. Such an SPI system includes an SPI master, a CS multiplier, a plurality of SPI slaves, and a fall time detection circuit. The SPI master is coupled to the CS multiplier and the fall time detection circuit by a CS signal line. The CS multiplier includes a plurality of CS outputs, with each CS output coupled to an SPI slave. The CS multiplier is configured to provide a CS signal on only one CS output at a time. CS multiplication in accordance with embodiments of the present invention includes: determining, by the SPI master, whether to configure the CS multiplier to vary from providing a CS signal on a first CS output to providing a CS signal on a second CS output; if the SPI master determines to configure the CS multiplier to vary from providing a CS signal on a first CS output to providing a CS signal on a second CS output: transmitting, by the SPI master to the fall time detection circuit and the CS multiplier, a CS signal having a fall time less than a predefined threshold; and if the SPI master determines not to configure the CS multiplier to vary from providing a CS signal on a first CS output to providing a CS signal on a second CS output: transmitting, by the SPI master to the fall time detection circuit and the CS multiplier, a CS signal having a fall time not less than the predefined threshold.

CS multiplication in accordance with embodiments of the present invention may also include: monitoring, by the fall time detection circuit, a voltage of a CS signal on the CS signal line, the voltage alternating between a logic high voltage and a logic low voltage, including: receiving, from the SPI master, the CS signal on the CS signal line; and detecting, by the fall time detection circuit, fall time of the CS signal. If the fall time of the CS signal is less than a predefined threshold, the fall-time detection circuit, configures the CS multiplier to vary from providing a CS signal on a first CS output to providing a CS signal on a second CS output.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
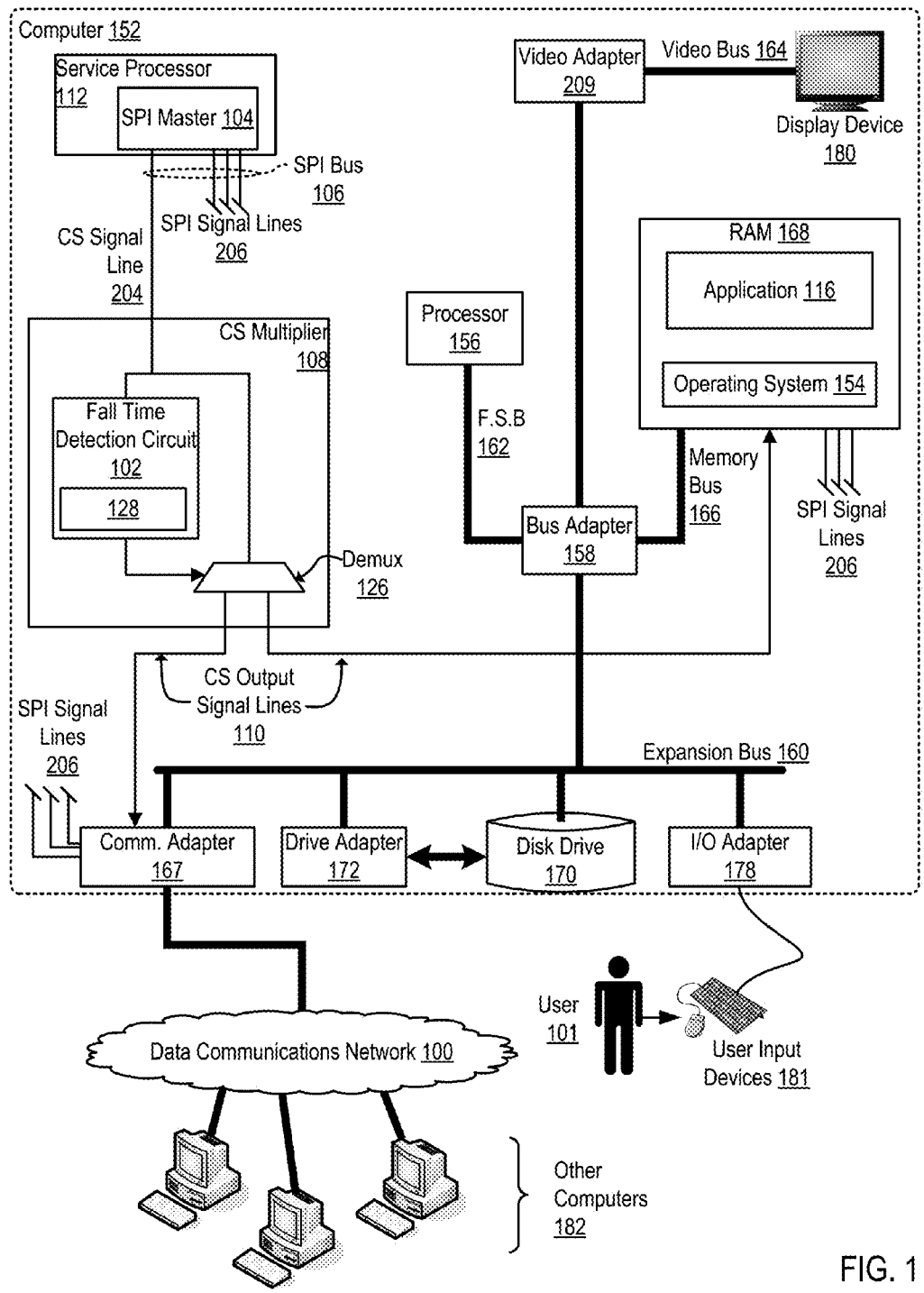
FIG. 1 sets forth a block diagram of an example system for CS multiplication in an SPI system according to embodiments of the present invention.

Exemplary methods, apparatus, and products for CS multiplication in an SPI system in accordance with the present invention are described with reference to the accompanying drawings, beginning with FIG. 1. FIG. 1 sets forth a block diagram of an example system for CS multiplication in an SPI system according to embodiments of the present invention. The system of FIG. 1 includes automated computing machinery comprising an exemplary computer (152) useful in CS multiplication in an SPI system according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is an application (116), a module of computer program instructions for carrying out user-level data processing tasks. Examples of such applications include word processing applications, spreadsheet applications, multimedia library and playback applications, presentation applications, database applications, and so on. Also stored in RAM (168) is an operating system (154). Operating systems useful for CS multiplication in an SPI system according to embodiments of the present invention include UNIX™, Linux™, Microsoft XP™, Windows 7™, AIX™, IBM's i5/OS™, and others as will occur to those of skill in the art. The operating system (154) and application (116) in the example of FIG. 1 are shown in RAM (168), but many components of such software typically are stored in non-volatile memory also, such as, for example, on a disk drive (170).

The computer (152) in the example of FIG. 1 also includes a service processor (112). A service processor as the term is used in this specification refers to a processor, field programmable gate array ('FPGA'), application specific integrated circuit ('ASIC') microcontroller, or the like, distinct from the main CPU (156), which manages platform-specific functions. Examples of such management include monitoring environmental conditions, handling certain error conditions, and otherwise communicating out-of-band with components of the computer (152). A service processor may include Read Only Memory ('ROM'), RAM, Electrically Erasable Programmable ROM ('EEPROM'), or other memory that includes computer program instructions executable by a processing core of the service processor (112).

In the example of FIG. 1, the service processor (112) communicates with components of the computer (152) through an out-of-band SPI bus (106). An SPI bus is a synchronous serial data link, capable of operating in full duplex. Devices in an SPI communicate in master and slave relationship where the master device initiates a data frame in data transmission. Multiple slave devices are allowed with individual slave select (chip select) lines. Sometimes SPI is called a four-wire serial bus, contrasting with three-, two-, and one-wire serial buses. In the example of FIG. 1, the SPI bus (106) includes four signal lines, one CS signal line (204), and three other signal lines (206).

The service processor (112) in the example of FIG. 1 is configured as an SPI master (104), while other peripherals, such as the communications adapter (167) and RAM (168) are configured as SPI slaves.

In the example of FIG. 1, the SPI master (104) is coupled to a CS multiplier (108) and a fall time detection circuit (102) by a CS signal line (204). The CS signal line (204) in the example of FIG. 1 is one of four signal lines making up the SPI bus (106). Also in the example of FIG. 1, the fall time detection circuit (102) is implemented as part of the CS multiplier (108). Readers of skill in the art will recognize, however, that the fall time detection circuit (102) may also be implemented separately from the CS multiplier (108). The CS multiplier (108) includes a plurality of CS outputs (110), with each CS output coupled to an SPI slave (167, 168). The CS multiplier is configured to provide a CS signal on only one CS output (110) at a time.

In the example of FIG. 1, the SPI master (104) determines whether to configure the CS multiplier to vary from providing a CS signal on a first CS output (110) to providing a CS signal on a second CS output (110). Here, the designation 'first' and 'second' when referring to CS outputs does not necessarily refer to order nor limits the CS multiplier to only two outputs. Instead, a CS multiplier may have any number of outputs, two and up.

A CS signal indicates, to an SPI slave, that a data transmission is intended for the SPI slave. The SPI master (104) therefore determines whether to configure the CS multiplier to vary the CS signal line output in dependence upon the destination of a data transmission.

If the SPI master (104) determines to configure the CS multiplier (108) to vary from providing a CS signal on a first CS output to providing a CS signal on a second CS output: the SPI master transmits, to the fall time detection circuit (102) and the CS multiplier (108), a CS signal having a fall time less than a predefined threshold (128). If the SPI master determines not to configure the CS multiplier to vary from providing a CS signal on a first CS output to providing a CS signal on a second CS output, the SPI master (104) transmits, to the fall time detection circuit (102) and the CS multiplier (108), a CS signal having a fall time not less than the predefined threshold (128).

The fall time detection circuit (102) in the example of FIG. 1 is configured to monitor a voltage of the CS signal on the CS signal line (204), where the voltage alternates between a logic high voltage and a logic low voltage. As part of the monitoring, the fall time detection circuit (102) receives, from the SPI master (104), the CS signal on the CS signal line (204) and detects fall time of the CS signal. If the fall time of the CS signal is less than a predefined threshold (128), the fall time detection circuit (102) configures the CS multiplier to vary from providing a CS signal on a first CS output to providing a CS signal on a second CS output. That is, the fall time detection circuit (102) switches the output of the CS multiplier. In the example of FIG. 1, the fall time detection circuit (102) carries out such a switch, through the use of a demultiplexer (126). In this way, the SPI master may control a CS multiplier through the use of fall time variations of the CS signal on a single CS signal line (204).

The computer (152) of FIG. 1 also includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for CS multiplication in an SPI system according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for CS multiplication in an SPI system according to embodiments of the present invention include modems for wired dial-up communications, Ethernet (IEEE 802.3) adapters for wired data communications, and 802.11 adapters for wireless data communications.

The arrangement of computers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
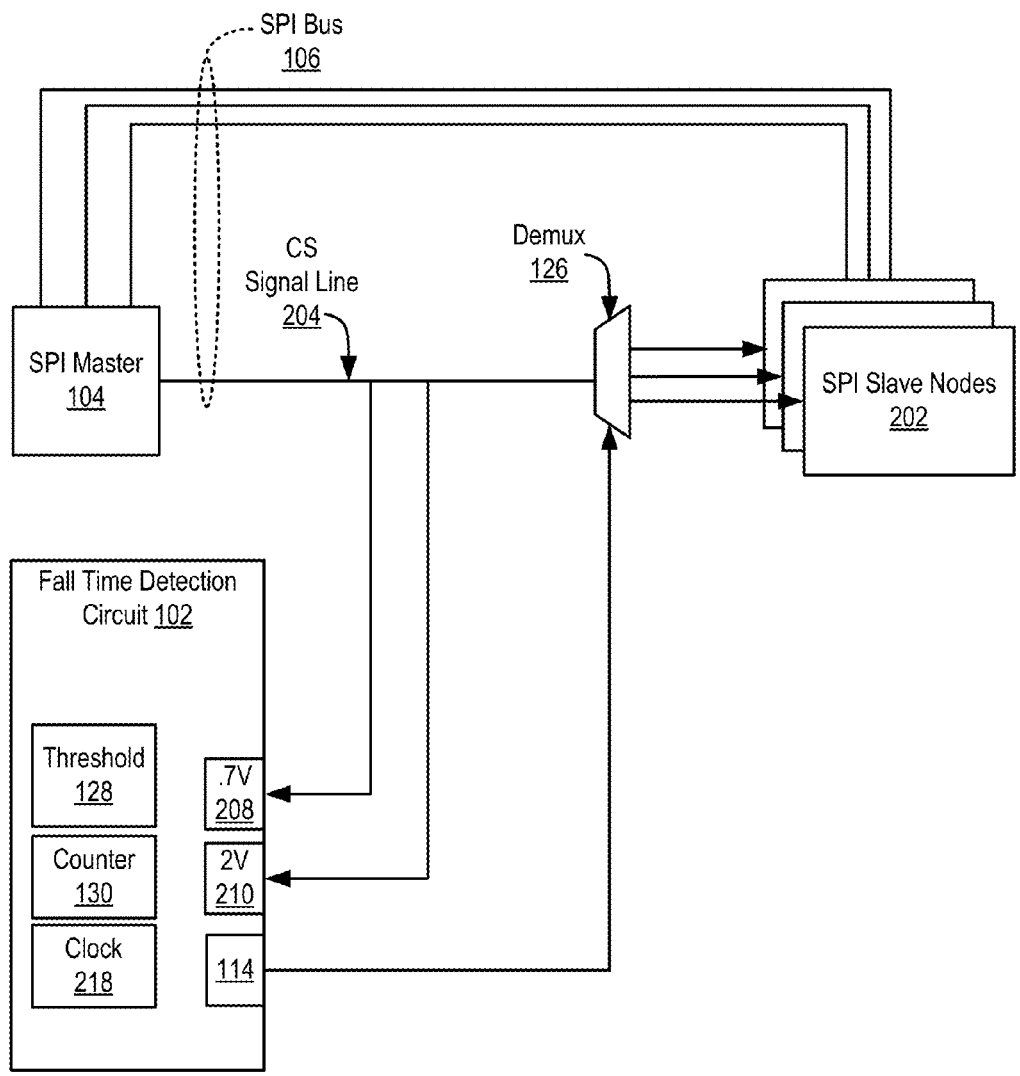
FIG. 2 sets forth a block diagram of another exemplary system for CS multiplication in an SPI system according to embodiments of the present invention.

For further explanation, FIG. 2 sets forth a block diagram of another exemplary system for CS multiplication in an SPI system according to embodiments of the present invention. The system of FIG. 2 includes an SPI master (104), a plurality of SPI slaves (202), a demultiplexer (126), and a fall time detection circuit (102). The master (104) is coupled for data communications to the slaves (202) by an SPI bus (106) and the demultiplexer (126). The bus (106) includes a plurality of signal lines, including in this example a chip select ('CS') signal line (204). The CS signal line (204) is coupled to the fall time detection circuit (102). The fall time detection circuit is configured to monitor a voltage of the CS signal line (204). The voltage alternates between a logic high voltage (such as 3.3V) and a logic low voltage (such as 0V).

In the example of FIG. 2, the demultiplexer (126) implements a CS multiplier. In some embodiments, the CS multiplier may also include the fall time detection circuit (102). The SPI master (104) in the example of FIG. 2 may determine whether to configure the demultiplexer (126) to vary from providing a CS signal on a first CS output to providing a CS signal on a second CS output. If the SPI master (104) determines to configure the CS multiplier to vary from providing a CS signal on a first CS output to providing a CS signal on a second CS output, the SPI master (104) transmits to the fall time detection circuit (102) and the demultiplexer (126), a CS signal having a fall time less than a predefined threshold (128). If the SPI master determines not to configure the demultiplexer (126) to vary from providing a CS signal on a first CS output to providing a CS signal on a second CS output, the SPI master (104) transmits, to the fall time detection circuit (102) and the demultiplexer, a CS signal having a fall time not less than the predefined threshold (128).

The fall time detection circuit (102) receives the signal transmitted by the SPI master (104). The fall time detection circuit detects a first voltage on the CS signal line, where the first voltage is less than the logic high voltage. The first voltage, for example, may be implemented as 2V. In the example of FIG. 2, the fall time detection circuit (102) includes two inputs (208, 210) for the CS signal line (204). One input (210) is configured to detect the first voltage (in this example, 2V) and another input (208) is configured to detect a second voltage (in this example, 0.7V).

Responsive to the detection of the first voltage, the fall time detection circuit (102) starts an automatically incrementing counter (130). The counter increments once for each clock (218) period of the fall time detection circuit (102). The period of the clock (218) of the fall time detection circuit (102) is less than the fall time of the CS signal line.

The fall time detection circuit (102) then detects a second voltage (0.7V in this example) on the CS signal line (204). The second voltage is less than the first voltage and greater than the logic low voltage. Responsive to the detection of the second voltage, the fall time detection circuit (102) stops the automatically incrementing counter (130).

The fall time detection circuit (102) then calculates, in dependence upon the clock period of the fall time detection circuit (102) and the value of the counter (130), a fall time for the CS signal line. The fall time detection circuit (102) may calculate such a fall time by calculating the product of the clock (218) period of the fall time detection circuit (102) and the value of the counter (130).

Figure 3:
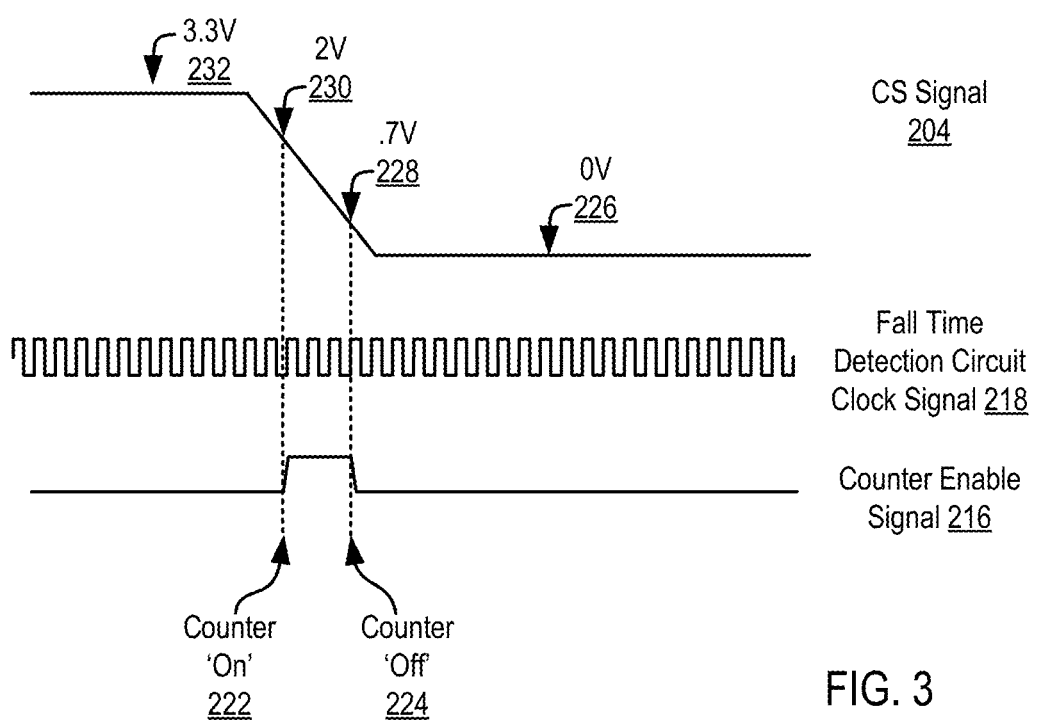
FIG. 3 sets forth an example signal timing diagram illustrating the one or more of the signals described in the example system of FIG. 2.

The fall time detection circuit (102) then determines whether the calculated fall time is less than the predefined threshold (128). If the fall time of the CS signal is less than the predefined threshold (128), the fall time detection circuit (112) configures the CS multiplier—the demultiplexer (126) in this example—to vary from providing a CS signal on a first CS output to providing a CS signal on a second CS output. FIG. 3 sets forth an example signal timing diagram illustrating the one or more of the signals described in the example system of FIG. 2. The example timing diagram of FIG. 3 includes a CS signal (204), the clock signal (218) of the fall time detection circuit (102), and an enable signal for the automatically incrementing counter (130)

In the example of FIG. 3, as the CS signal (204) falls, the fall time detection circuit (102) detects a first voltage (230) of 2 V on the signal line. Responsive to the detection of the first voltage (230), the fall time detection circuit (102) starts (222) an automatically incrementing counter (130) through use of the enable signal (216). The counter increments once for each clock signal (218) period of the fall time detection circuit (102).

As the CS signal (204) continues to fall, the fall time detection circuit (102) detects a second voltage (228) of 0.7V on the CS signal line. Responsive to the detection of the second voltage (228), the fall time detection circuit (102) stops (224) the automatically incrementing counter (130), again through use of the counter enable signal (216).

The fall time detection circuit (102) then calculates a fall time for the CS signal line (204) in dependence upon the period of the clock signal (218) and the value of the counter. In the example of FIG. 3, three periods of the fall time detection circuit clock signal (218) elapse during the time in which the counter is automatically incrementing. That is, the value of the counter is three. Consider, as an example, that the period of the clock signal is 10 nanoseconds (ns). In such an example, the fall time detection circuit may calculate a fall time of 30 ns (the counter value of 3 multiplied by 10 nanoseconds per clock period).

The fall time detection circuit (102) then determines whether the calculated fall time is less than a predefined threshold. If the calculated fall time is less than the predefined threshold, configures the CS multiplier to vary from providing a CS signal on a first CS output to providing a CS signal on a second CS output.

Figure 4:
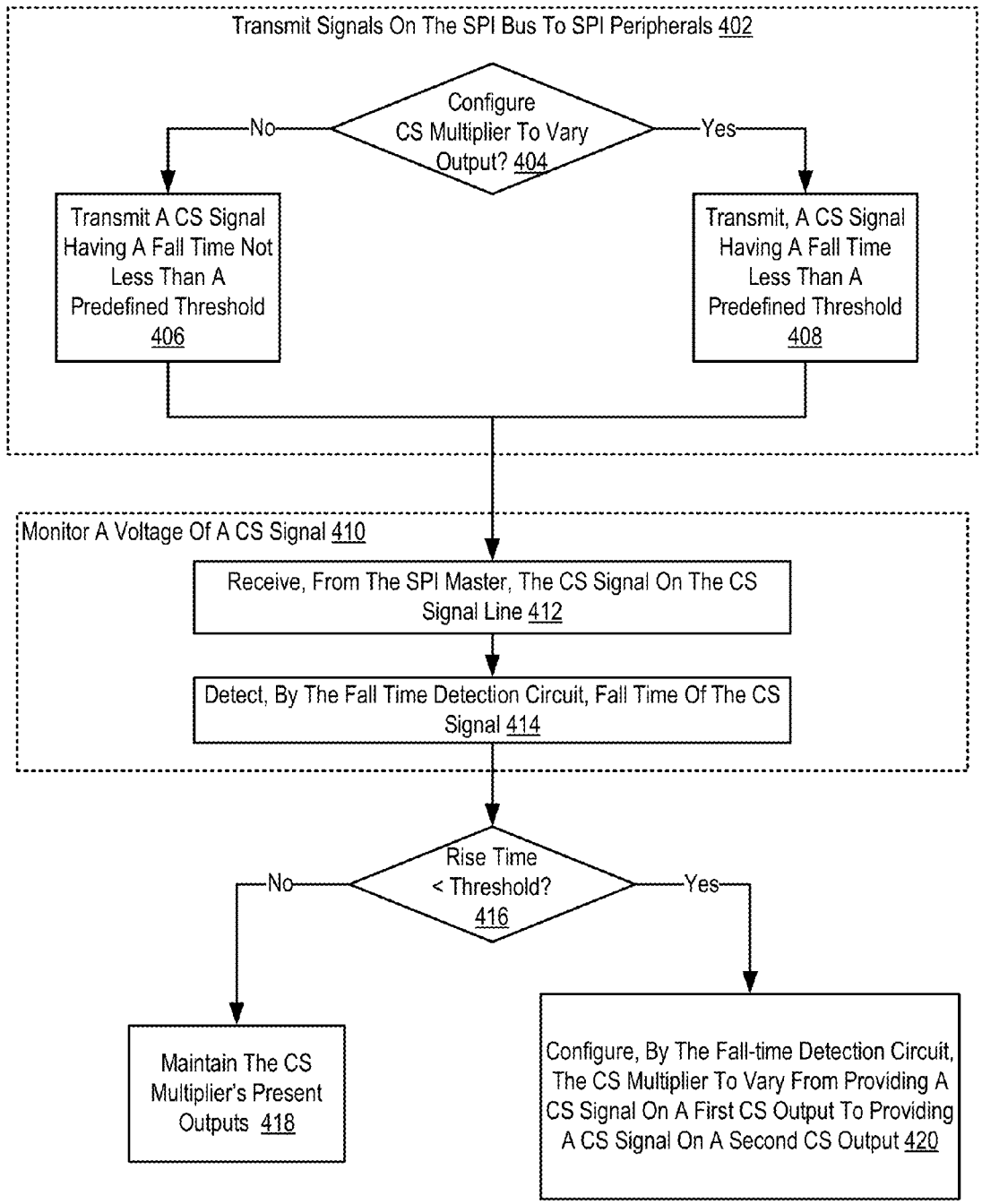
FIG. 4 sets forth a flow chart illustrating an exemplary method for CS multiplication in an SPI system according to embodiments of the present invention.

For further explanation, FIG. 4 sets forth a flow chart illustrating an exemplary method for CS multiplication in an SPI system according to embodiments of the present invention. The SPI system in which the method of FIG. 4 is carried out is similar to the system set forth in the example of FIG. 2 which includes an SPI master, a CS multiplier, a plurality of SPI slaves, and a fall time detection circuit. The SPI master is coupled to the CS multiplier and the fall time detection circuit by a CS signal line. The CS multiplier includes a plurality of CS outputs with each CS output coupled to an SPI slave. The CS multiplier is configured to provide a CS signal on only one CS output at a time. In some embodiments, the CS multiplier includes the fall time detection circuit.

The method of FIG. 4 includes transmitting (402), by the SPI master, signals on the SPI bus to SPI slaves. In the method of FIG. 4, transmitting (402) signals on the SPI bus to SPI slaves includes determining (404), by the SPI master, whether to configure the CS multiplier to vary from providing a CS signal on a first CS output to providing a CS signal on a second CS output. If the SPI master determines to configure the CS multiplier to vary from providing a CS signal on a first CS output to providing a CS signal on a second CS output, the method of FIG. 4 continues by transmitting (408), by the SPI master to the fall time detection circuit and the CS multiplier, a CS signal having a fall time less than a predefined threshold. If the SPI master determines not to configure the CS multiplier to vary from providing a CS signal on a first CS output to providing a CS signal on a second CS output, the method of FIG. 4 continues by transmitting (406), by the SPI master to the fall time detection circuit and the CS multiplier, a CS signal having a fall time not less than the predefined threshold.

In the method of FIG. 4, transmitting (408) a CS signal having a fall time less than a predefined threshold may be carried out by driving the CS signal to a logic low with an active driver, such as a tri-state buffer. Also in the method of FIG. 4, transmitting (406) a CS signal having a fall time not less than a predefined threshold may be carried out by driving the CS signal to a logic low passively. Passively driving the CS signal low may be carried out by a pull-down resistor, rather than actively driving the signal low with a tri-state active buffer or other driver.

The method of FIG. 4 also includes monitoring (410), by the fall time detection circuit, a voltage of a CS signal on the CS signal line, where the voltage alternating between a logic high voltage and a logic low voltage. In the method of FIG. 4, monitoring (410) the voltage of the CS signal on the CS signal line includes receiving (412), from the SPI master, the CS signal on the CS signal line and detecting (414), by the fall time detection circuit, fall time of the CS signal. In the method of FIG. 4, detecting (414) fall time of the CS signal may be carried out by detecting a first voltage of the CS signal, the first voltage being less than the logic high voltage; starting, responsive to the detection of the first voltage, an automatically incrementing counter, the counter incrementing once for each clock period of the fall time detection circuit; detecting a second voltage on the signal line, the second voltage being less than the first voltage and greater than the logic low voltage; stopping, responsive to the detection of the second voltage, the automatically incrementing counter; and calculating, in dependence upon the clock period of the fall time detection circuit and the value of the counter, a fall time for the signal line.

The method of FIG. 4 also includes determining (416), whether the fall time of the CS signal is less than a predefined threshold. If the fall time of the CS signal is not less than a predefined threshold, the method of FIG. 4 continues by maintaining (418) the CS multiplier's present output. If, however, the fall time of the CS signal is not less than a predefined threshold, the method of FIG. 4 continues by configuring (420), by the fall-time detection circuit, the CS multiplier to vary from providing a CS signal on a first CS output to providing a CS signal on a second CS output. In this way, a single CS signal may be utilized for two separate SPI slave peripherals through the SPI master's control of the fall time of the CS signal.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
monitoring, by a fall time detection circuit, a voltage of a chip select ('CS') signal on an CS signal line, the voltage alternating between a logic high voltage and a logic low voltage, including:
   detecting a fall time of the CS signal including:
      starting, responsive to the detection of a first voltage of the CS signal, an automatically incrementing counter, the counter incrementing once for each clock period of the fall time detection circuit;
      stopping, responsive to a detection of a second voltage on the signal line, the automatically incrementing counter; and
      calculating, in dependence upon the clock period of the fall time detection circuit and the value of the counter, a fall time for the signal line; and
   if the fall time of the CS signal is less than a predefined threshold, configuring, by the fall-time detection circuit, a CS multiplier to provide a CS signal on one of a plurality of CS outputs in dependence upon the fall time of the CS signal.

2. The method of claim 1 wherein the CS multiplier comprises the fall time detection circuit.

3. The method of claim 1 wherein detecting the fall time of the CS signal further comprises:
detecting the first voltage of the CS signal, the first voltage being less than the logic high voltage;
detecting the second voltage on the signal line, the second voltage being less than the first voltage and greater than the logic low voltage.

4. The method of claim 1 wherein:
the fall time of the signal is less than a predefined threshold responsive to an SPI master driving the signal to a logic low with an active driver; and
the fall time of the signal is not less than a predefined threshold responsive to the SPI master driving the signal to a logic low passively.

5. A fall time detection circuit configured to carry out the steps of:
monitoring, by the fall time detection circuit, a voltage of an CS signal on an CS signal line, the voltage alternating between a logic high voltage and a logic low voltage, including:
   detecting a fall time of the CS signal including:
      starting, responsive to the detection of a first voltage of the CS signal, an automatically incrementing counter, the counter incrementing once for each clock period of the fall time detection circuit;
      stopping, responsive to a detection of a second voltage on the signal line, the automatically incrementing counter; and
      calculating, in dependence upon the clock period of the fall time detection circuit and the value of the counter, a fall time for the signal line; and
   if the fall time of the CS signal is less than a predefined threshold, configuring, by the fall-time detection circuit, a CS multiplier to provide a CS signal on one of a plurality of CS outputs in dependence upon the fall time of the CS signal.

6. The fall time detection circuit of claim 5 wherein the CS multiplier comprises the fall time detection circuit.

7. The fall time detection circuit of claim 5 wherein detecting the fall time of the CS signal further comprises:
detecting the first voltage of the CS signal, the first voltage being less than the logic high voltage;
detecting the second voltage on the signal line, the second voltage being less than the first voltage and greater than the logic low voltage.

8. The fall time detection circuit of claim 5 wherein:
the fall time of the signal is less than a predefined threshold responsive to an SPI master driving the signal to a logic low with an active driver; and
the fall time of the signal is not less than a predefined threshold responsive to the SPI master driving the signal to a logic low passively.

9. A method comprising:
determining, by an SPI master, whether to configure an CS multiplier to vary from providing a CS signal on a first CS output to providing a CS signal on a second CS output;
if the SPI master determines to configure the CS multiplier to vary from providing a CS signal on a first CS output to providing a CS signal on a second CS output: transmitting, by the SPI master to a fall time detection circuit and the CS multiplier, a CS signal having a fall time within a first range; and
if the SPI master determines not to configure the CS multiplier to vary from providing a CS signal on a first CS output to providing a CS signal on a second CS output: transmitting, by the SPI master to the fall time detection circuit and the CS multiplier, a CS signal having a fall time within a second range, wherein no values are within both the first range and the second range, wherein the fall time detection circuit is configured to: detect fall time of the CS signal and configure the CS multiplier to provide a CS signal on one of a plurality of CS outputs in dependence upon the fall time of the CS signal.

10. The method of claim 9 wherein the CS multiplier comprises the fall time detection circuit.

11. The method of claim 9 wherein:
transmitting a CS signal having a fall time within the first range further comprises driving the CS signal to a logic low with an active driver; and
transmitting a CS signal having a fall time within the second range further comprises driving the CS signal to a logic low passively.

12. An apparatus comprising a computer processor, a computer memory operatively coupled to the computer processor, the computer memory having disposed within it computer program instructions that, when executed by the computer processor, cause the apparatus to carry out the steps of:
determining, by an SPI master, whether to configure an CS multiplier to vary from providing a CS signal on a first CS output to providing a CS signal on a second CS output;
if the SPI master determines to configure the CS multiplier to vary from providing a CS signal on a first CS output to providing a CS signal on a second CS output: transmitting, by the SPI master to a fall time detection circuit and the CS multiplier, a CS signal having a fall time within a first range; and
if the SPI master determines not to configure the CS multiplier to vary from providing a CS signal on a first CS output to providing a CS signal on a second CS output: transmitting, by the SPI master to the fall time detection circuit and the CS multiplier, a CS signal having a fall time within a second range, wherein no values are within both the first range and the second range,
wherein the fall time detection circuit is configured to: detect fall time of the CS signal and configure the CS multiplier to provide a CS signal on one of a plurality of CS outputs in dependence upon the fall time of the CS signal.

13. The apparatus of claim 12 wherein the CS multiplier comprises the fall time detection circuit.

14. The apparatus of claim 12 wherein:
transmitting a CS signal having a fall time within the first range further comprises driving the CS signal to a logic low with an active driver; and
transmitting a CS signal having a fall time within the second range further comprises driving the CS signal to a logic low passively.

15. A computer program product disposed upon a computer readable medium, the computer program product comprising computer program instructions that, when executed, cause a computer to carry out the steps of: determining, by an SPI master, whether to configure an CS multiplier to vary from providing a CS signal on a first CS output to providing a CS signal on a second CS output;
if the SPI master determines to configure the CS multiplier to vary from providing a CS signal on a first CS output to providing a CS signal on a second CS output: transmitting, by the SPI master to a fall time detection circuit and the CS multiplier, a CS signal having a fall time within a first range; and
if the SPI master determines not to configure the CS multiplier to vary from providing a CS signal on a first CS output to providing a CS signal on a second CS output: transmitting, by the SPI master to the fall time detection circuit and the CS multiplier, a CS signal having a fall time within a second range, wherein no values are within both the first range and the second range,
wherein the fall time detection circuit is configured to: detect fall time of the CS signal and configure the CS multiplier to provide a CS signal on one of a plurality of CS outputs in dependence upon the fall time of the CS signal.

16. The computer program product of claim 15 wherein the CS multiplier comprises the fall time detection circuit.

17. The computer program product of claim 15 wherein:
transmitting a CS signal having a fall time within the first range further comprises driving the CS signal to a logic low with an active driver; and
transmitting a CS signal having a fall time within the second range further comprises driving the CS signal to a logic low passively.

18. The computer program product of claim 15 wherein the computer readable medium comprises a storage medium.

\* \* \* \* \*